US010687445B2

(12) United States Patent
Matsumoto (10) Patent No.: US 10,687,445 B2
(45) Date of Patent: *Jun. 16, 2020

(54) ORGANIC EL DISPLAY APPARATUS (71) Applicant: JOLED INC., Tokyo (JP)

(72) Inventor: Kenichi Matsumoto, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/117,844

(22) Filed: Aug. 30, 2018

(65) Prior Publication Data
US 2018/0376627 A1 Dec. 27, 2018

Related U.S. Application Data (63) Continuation of application No. 15/320,973, filed as application No. PCT/JP2015/002723 on May 29, 2015, now Pat. No. 10,104,815.

(51) Int. Cl.
*H05K 7/20* (2006.01)
*H01L 51/52* (2006.01)
*G09G 3/3208* (2016.01)
*H01L 51/50* (2006.01)
*H01L 27/32* (2006.01)

(52) U.S. Cl.
CPC ....... *H05K 7/20963* (2013.01); *G09G 3/3208* (2013.01); *H01L 27/32* (2013.01); *H01L 51/50* (2013.01); *H01L 51/524* (2013.01); *H01L 51/529* (2013.01); *G09G 2330/045* (2013.01)

(58) Field of Classification Search
CPC ..... H01L 51/529; H01L 51/524; H01L 51/50; H01L 27/32; G09G 3/3208; G09G 2330/045; H05K 7/20963; H05K 7/20954
See application file for complete search history.

(56) References Cited

U.S. PATENT DOCUMENTS 3,559,190 A * 1/1971 Bitzer et al. ......... G09G 3/2007
313/484
7,436,668 B2 10/2008 Bae
(Continued)

FOREIGN PATENT DOCUMENTS

JP 2008-270453 11/2008

OTHER PUBLICATIONS

International Search Report, dated Aug. 18, 2015 from the Japan Patent Office (JPO), in the corresponding International Patent Application No. PCT/JP2015/002723.

*Primary Examiner* — Zachary Pape
(74) *Attorney, Agent, or Firm* — Greenblum & Bernstein, P.L.C.

(57) ABSTRACT

A display apparatus is provided that includes a display panel, a plate-shaped base disposed on a rear surface side of the display panel, and a flexible wiring substrate. The display apparatus also includes a circuit substrate, an electronic component attached to at least one of the wiring substrate and the circuit substrate, and a heat conductive member attached to a rear surface of the electronic component. The display apparatus further includes a rear structural member disposed to cover the heat conductive member, and a connecting member that connects the base and the rear structural member and generates a compressive force that compresses the heat conductive member being sandwiched by the electronic component and the rear structural member.

9 Claims, 8 Drawing Sheets (56) References Cited

U.S. PATENT DOCUMENTS

| | | |
|---|---|---|
| 7,705,536 B2 | 4/2010 | Yanagawa |
| 8,284,328 B2 | 10/2012 | Shinki |
| 2006/0125720 A1* | 6/2006 | Kim ........................ H01J 11/10 345/60 |
| 2006/0203445 A1 | 9/2006 | Hsu |
| 2008/0258290 A1 | 10/2008 | Nakajima |
| 2014/0268595 A1* | 9/2014 | Eom ...................... H05K 1/028 361/749 |

* cited by examiner

ORGANIC EL DISPLAY APPARATUS

CROSS-REFERENCE TO RELATED APPLICATIONS

This application is a continuation of pending U.S. application Ser. No. 15/320,973, filed Dec. 21, 2016, which is a U.S. National Stage application of PCT application PCT/JP2015/002723, filed on May 29, 2015, which claims priority of Japanese Patent Application No. 2014-131524, filed Jun. 26, 2014. The disclosure of these documents, including the specifications, drawings, and claims are incorporated herein by reference in their entirety.

TECHNICAL FIELD

The present disclosure relates to an organic electroluminescent (EL) display apparatus including an organic EL panel.

BACKGROUND ART

An organic EL display apparatus such as a television set includes a display panel in which organic electroluminescent (EL) elements are arranged in a matrix, a circuit substrate having a plurality of electronic components, a wiring substrate, and the like. Furthermore, the organic EL display apparatus includes a member that structurally holds and protects the display panel and the substrates, and the like.

Patent Literature (PTL) 1 discloses a technique for improving heat dissipation efficiency of an electronic component attached to a wiring substrate for use in an organic EL display apparatus or the like.

CITATION LIST

Patent Literature

[PTL 1]
Japanese Unexamined Patent Application Publication No. 2008-270453

SUMMARY OF INVENTION

Technical Problem

The present disclosure provides an organic EL display apparatus in which heat generated by an electronic component is efficiently transferred to a structural member to enhance a heat dissipation effect.

Solution to Problem

An organic EL display apparatus according to the present disclosure includes: a display panel that displays images; a plate-shaped base that is disposed on a rear surface side of the display panel, the rear surface side being opposite to a display surface side of the display panel where the images are displayed; a flexible wiring substrate that is connected to a peripheral edge portion on the display surface side of the display panel; a circuit substrate that is disposed on a rear surface side of the base and is connected to the wiring substrate; an electronic component that is attached to at least one of the wiring substrate and the circuit substrate; a heat conductive member that is attached to a rear surface of the electronic component; a rear structural member that is a structural member disposed on a rear surface side of the heat conductive member to cover the heat conductive member; and a connecting member that mechanically connects the base and the rear structural member and generates a compressive force that compresses the heat conductive member being sandwiched by the electronic component and the rear structural member and maintains the compressed state.

Advantageous Effects of Invention

With the organic EL display apparatus according to the present disclosure, the heat conductive member compressed by the electronic component and the rear structural member can efficiently transfer heat from the electronic component to the rear structural member. Accordingly, the rear structural member can efficiently dissipate heat from the electronic component.

DESCRIPTION OF EMBODIMENTS

The present disclosures found that a conventional display apparatus has the following problem.

In a conventional display apparatus, the amount of heat generated from the electronic component is relatively small, and there is a large space for storing the electronic component. Accordingly, heat can be dissipated by natural or forced convection of the ambient air of the electronic component.

However, in a recent display apparatus such as, for example, an organic EL display apparatus, the amount of heat generated from the electronic circuit that drives the display panel is relatively large, and the organic EL display apparatus is configured to be thin as a whole. Accordingly, the present disclosures found that it can be difficult to sufficiently dissipate heat by convection of the ambient air of the electronic component.

The present disclosure has been made in view of the problem described above. Hereinafter, an embodiment will be described with reference to the drawings as appropriate. However, an overly detailed description may be omitted. For example, a detailed description of already known matters and a redundant description of substantially the same configuration may be omitted. This is to prevent the following description from being unnecessarily lengthy and to facilitate the understanding of a person having ordinary skill in the art.

The present disclosures provide the accompanying drawings and the following description for a person having ordinary skill in the art to sufficiently understand the present disclosure, and thus the drawings and the description are not intended to limit a subject matter recited in the claims.

Embodiment 1

Configuration of Organic EL Display Apparatus

Figure 1:
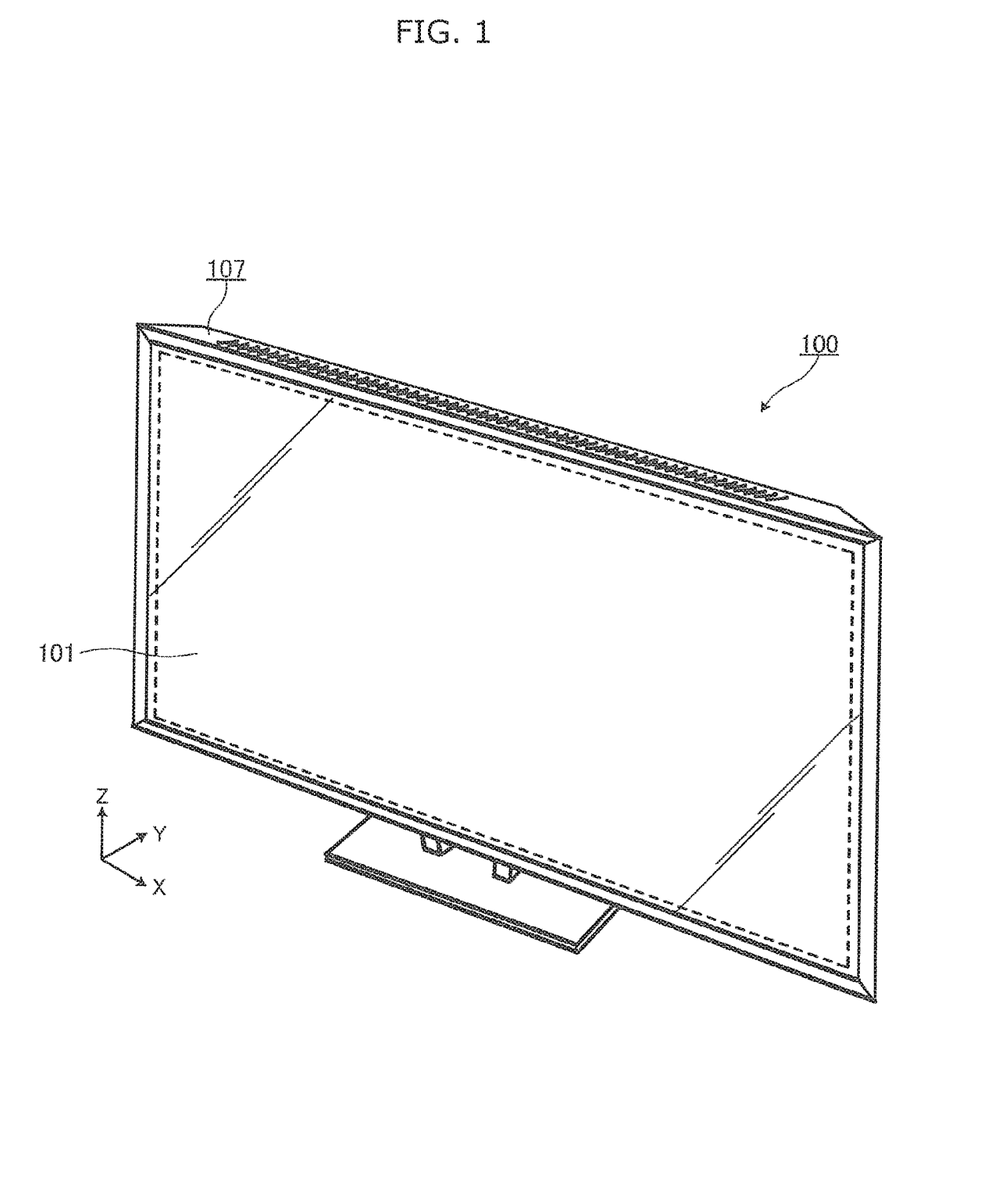
FIG. 1 is a perspective view showing an external appearance of an organic EL display apparatus.

FIG. 1 is a perspective view showing an external appearance of an organic EL display apparatus.

Figure 2:
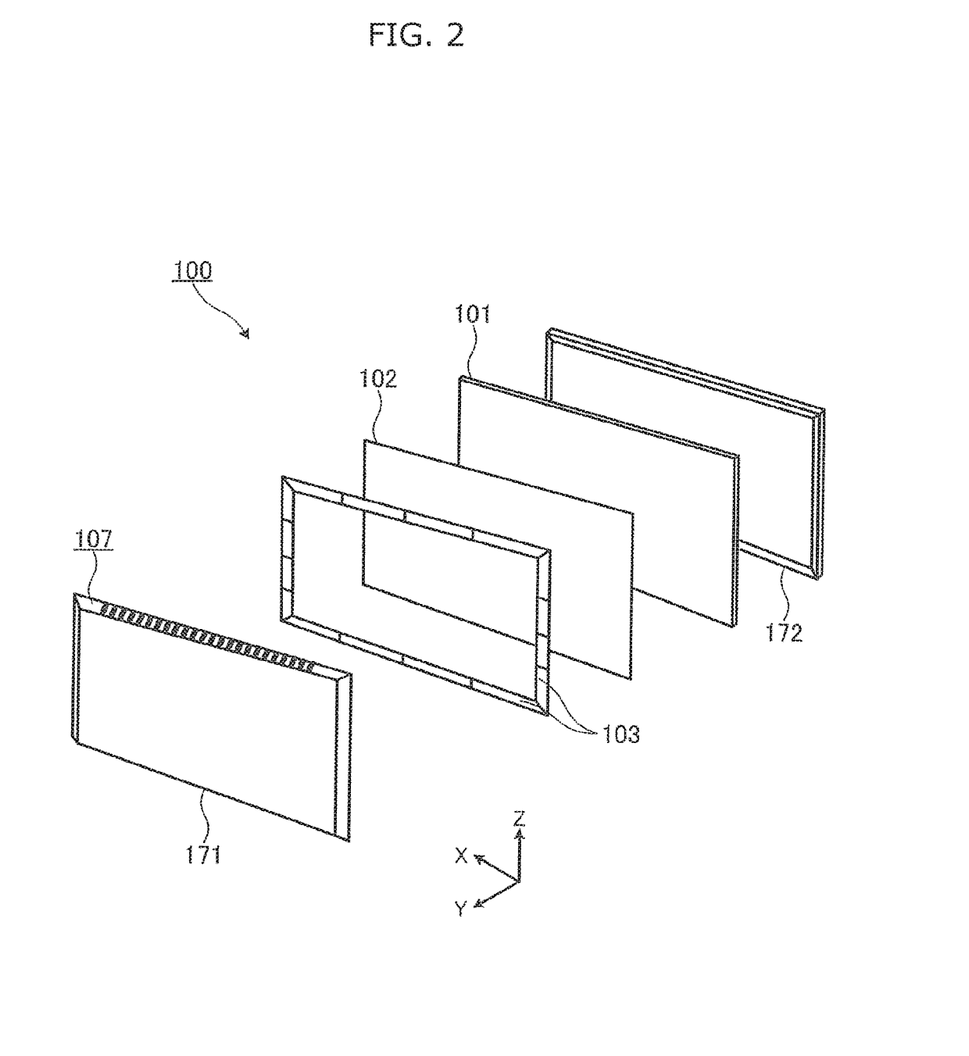
FIG. 2 is an exploded perspective view showing an overall structure of the organic EL display apparatus.

FIG. 2 is an exploded perspective view showing an overall structure of the organic EL display apparatus.

Figure 3:
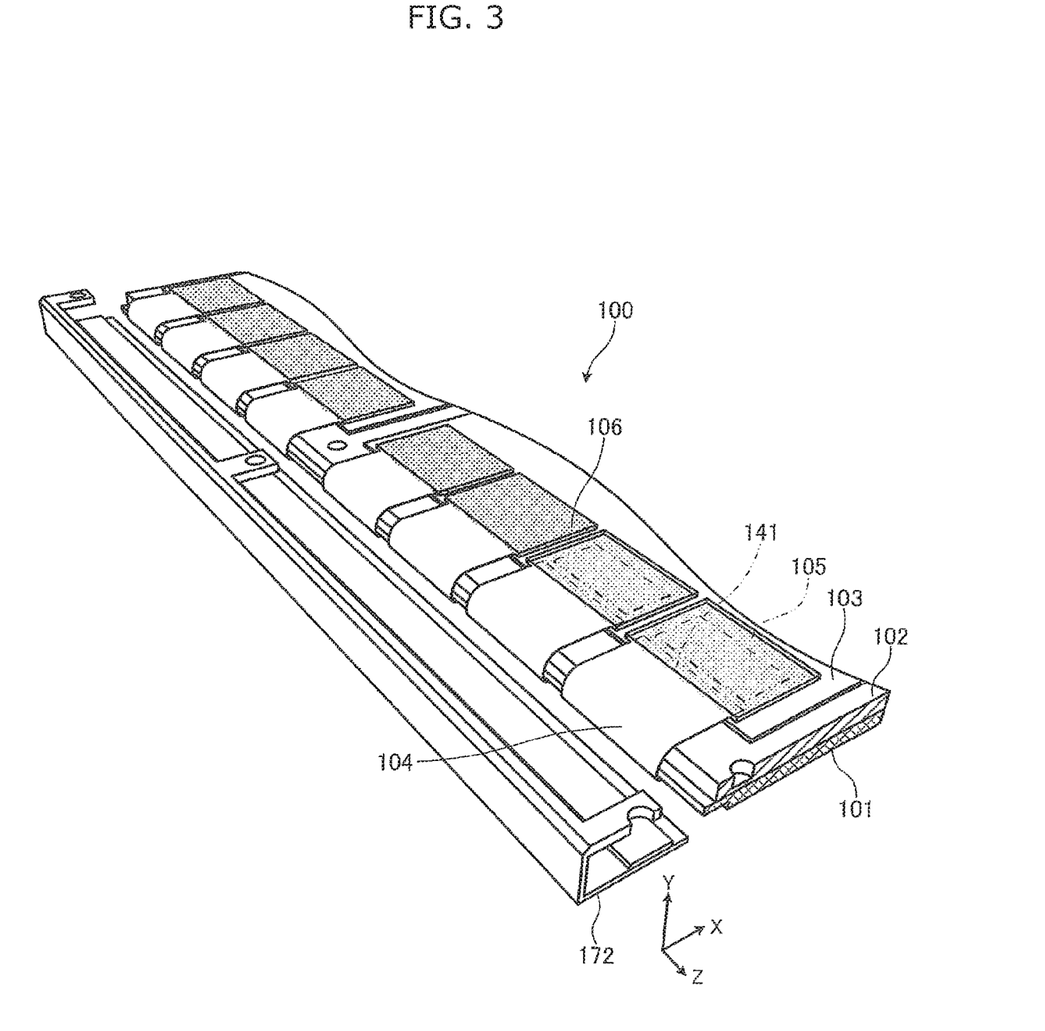
FIG. 3 is an exploded perspective view showing a relationship between a base and a frame member in the organic EL display apparatus.

FIG. 3 is an exploded perspective view showing a relationship between a base and a frame member in the organic EL display apparatus.

Figure 4:
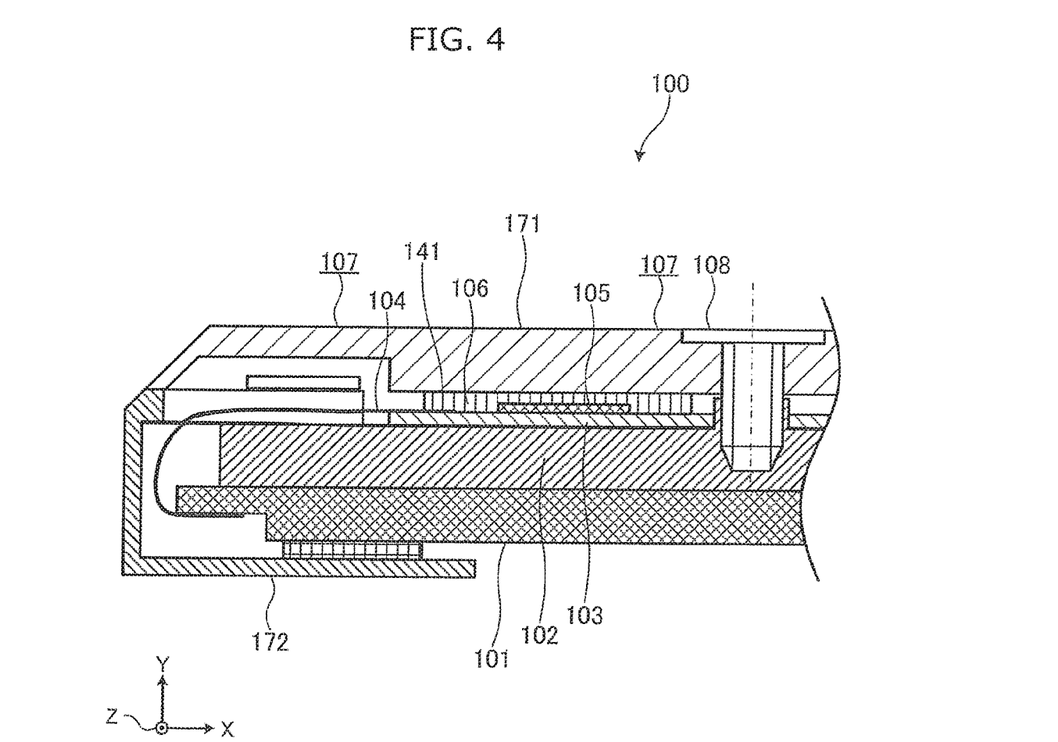
FIG. 4 is a side view showing the vicinity of an electronic component in cross section.

FIG. 4 is a side view showing the vicinity of an electronic component in cross section.

These diagrams are schematic representations of the overall configuration of an organic EL display apparatus 100, and details are omitted.

As shown in these diagrams, the organic EL display apparatus 100 is, for example, a television set that outputs video and audio obtained from received broadcast waves and the like, and includes a display panel 101, a base 102, a wiring substrate 104, a circuit substrate 103, an electronic component 105, a heat conductive member 106, a rear structural member 107, and a connecting member 108 (not shown in FIGS. 1 to 3).

The display panel 101 is a device that displays images or the like. The display panel 101 is a device in which organic electroluminescent (EL) diodes, which are light emitting diodes having a light emitting layer composed of an organic compound and serving as light emitting elements, and electronic circuits including switch elements for driving the organic EL diodes, capacitive elements and the like are arranged in a matrix on a glass substrate. The light emitting elements can be driven independently, and ends of conductive lines for supplying signals and power for driving the light emitting elements to the light emitting elements are provided on a peripheral edge portion of the glass substrate. Also, the display panel 101 has a total thickness of, for example, about 1 to 3 mm.

The base 102 is a plate-shaped member that is disposed on a rear surface (the surface on the positive side of Y axis in the diagrams) of the display panel 101 and that holds the display panel 101, the rear surface being the side opposite to a display surface of the display panel 101 where images are displayed. Also, the base 102 holds the circuit substrate 103 on its rear surface. The base 102 is made of, for example, a metal board generally called a chassis, and may have irregularities formed by press working or the like in order to improve the structural strength. Furthermore, bosses for receiving screws or the like may be provided in the base 102. Also, the base 102 may be disposed so as to cover the entirety (or substantially the entirety) of the rear surface of the display panel 101, and have a function of dissipating heat generated by the display panel 101.

The display panel 101, the base 102 and the like are shown in the diagrams, but the specific shape and size of each portion, the relative proportion of members and the like may be simplified or omitted for the sake of description.

The wiring substrate 104 is a flexible substrate that has one end that is electrically connected to the conductive lines provided on the peripheral edge portion on the display surface side of the display panel 101 and that is mechanically connected to the glass substrate and the like. Also, the other end of the wiring substrate 104 is electrically and mechanically connected to the circuit substrate 103. The wiring substrate 104 is disposed, by utilizing its flexibility, so as to extend beyond a peripheral edge of a stack of the base 102 and the display panel 101 and be bent to the rear surface side of the base 102. Here, the wiring substrate 104 is, for example, as shown in FIG. 3, a flexible printed wiring substrate on which an electronic component is not mounted, a flexible printed wiring substrate on which an electronic component is mounted, a so-called COF (chip on film), or the like. In the case of the present embodiment, a plurality of (four in the present embodiment) wiring substrates 104 are arranged in a line and connected to one circuit substrate 103.

The circuit substrate 103 is, for example, a substrate on which an electric circuit composed of a plurality of electronic components is disposed on a substrate body that uses a resin board as the base member. To be specific, for example, the circuit substrate 103 is a substrate on which a scan drive circuit that supplies a scan drive signal to the display panel 101, a signal line drive circuit that supplies a signal voltage to the display panel 101, and the like are mounted, and the circuit substrate 103 is disposed so as to extend along the periphery of the base 102. The scan drive circuit is also called a gate driver, a scan driver or the like, and the signal line drive circuit is also called a data driver, a source driver or the like.

Note that FIG. 4 shows a circuit substrate 103 illustratively and schematically, and thus not all of the circuit substrates 103 that are required for the organic EL display apparatus 100 are illustrated. Also, a plurality of circuit substrates having the above-described function, which are not shown in FIG. 4, are also attached to the base 102. To be specific, such circuit substrates may include, for example, a signal processing circuit that processes a received video signal, a power supply circuit that receives power from the outside and supplies the power to each circuit, and the like.

The electronic component 105 is an electronically (electrically) functional member that is attached to at least one of the wiring substrate 104 and the circuit substrate 103. In the case of the present embodiment, the electronic component 105 is attached to the circuit substrate 103. To be specific, the electronic component 105 can be, for example, an electronic component called a driver IC that directly drives the electronic circuits provided on the display panel 101, or the like.

The heat conductive member 106 is a member that is attached to a rear surface of the electronic component 105 and is a member that conducts heat generated from the electronic component 105 to the rear structural member 107. The heat conductive member 106 is a member that has a higher heat conductivity than at least air. Also, the heat conductive member 106 has a flexibility of being sandwiched and compressed between the electronic component 105 and the rear structural member 107 in the assembled organic EL display apparatus 100, and also has a biasing force (restoring force) for making close contact with the electronic component 105 and the rear structural member 107 in the compressed state. To be specific, the heat conductive member 106 is a member called a heat conductive sheet or the like, and a member that maintains its sheet shape (plate shape) in an unpressurized state, upon application of pressure, deforms along the surface shape of a member applying the pressure, and restores its substantially original shape upon release of the pressure.

Also, the heat conductive member 106 may have tackiness on at least a surface that is brought into contact with the electronic component 105. With this configuration, the position of the heat conductive member 106 can be easily maintained at the time of assembly of the organic EL display apparatus 100. Also, by bonding the electronic component 105 to another member (for example, the circuit substrate 103 or the wiring substrate 104) with the use of the heat conductive member 106, the strength of attachment can be improved. The heat conductive member 106 itself may be tacky, or tackiness may be imparted to the heat conductive member 106 by applying an adhesive or the like.

In the case of the present embodiment, as shown in FIGS. 3 and 4, the heat conductive member 106 is disposed so as to extend along the rear surface of the electronic component 105 to the outside of the electronic component 105, and to further extend to a connecting portion 141 connecting the wiring substrate 104 and the circuit substrate 103. Then, upon application of a compressive force generated by the connecting member 108, the flexible heat conductive member 106 deforms so as to surround the electronic component 105, and covers the connecting portion 141 while being in contact therewith.

The rear structural member 107 is one of the structural members that ensure the structural strength of the organic EL display apparatus 100, and is a member that is in contact with the rear surface of the heat conductive member 106 and is capable of dissipating heat transferred from the heat conductive member 106. In the case of the present embodiment, the rear structural member 107 can be a back cover 171 that covers the rear surface of the organic EL display apparatus 100 and protects the circuit substrate 103 and the display panel 101.

In the case of the present embodiment, the back cover 171 serving as the rear structural member 107 is a thin metal board, and is sized to cover the entire rear side of the display panel 101. Accordingly, it is possible to efficiently dissipate heat transferred from the electronic component 105.

There is no particular limitation on the rear structural member 107, and in the case where a bezel 172 for protecting the peripheral edge portion of the display panel 101 has a structure in which a part of the bezel 172 extends to the rear surface side of the heat conductive member 106 so as to come into pressing contact with the heat conductive member 106, the bezel 172 functions as the rear structural member 107.

Also, in the case where the back cover 171 or the like and the bezel 172 or the like cooperatively dissipate heat generated from the electronic component 105, they function as the rear structural member 107.

As shown in FIG. 4, the connecting member 108 is a member that mechanically connects the base 102 and the rear structural member 107 (the back cover 171 in the case of the present embodiment) so as to generate a compressive force that compresses the heat conductive member 106 being sandwiched by the electronic component 105 and the rear structural member 107 and maintains the compressed state.

In the case of the present embodiment, the connecting member 108 is a screw (bolt), and as a result of the connecting member 108 being screwed into a threaded hole formed in the base 102, the distance between the electronic component 105 and the rear structural member 107 is reduced to generate a compressive force that compresses the heat conductive member 106.

Also, the heat conductive member 106 is disposed so as to extend along the rear surface of the electronic component 105 to the outside of the electronic component 105, and to further extend to the connecting portion connecting the wiring substrate and the circuit substrate, and is connected to the connecting portion by the compressive force generated by the connecting member.

There is no particular limitation on the connecting member 108 as long as it is possible to generate the compressive force. For example, as the connecting member 108, a rivet or the like may be used, or a part of the base 102 may be plastically deformed so as to function as the connecting member 108.

Method for Producing Organic EL Display Apparatus

A method for producing an organic EL display apparatus 100 will described next.

A display panel 101 and a plate-shaped base 102, which is disposed on the rear surface side of the display panel 101, are adhesively attached by using, for example, a double-sided tape or the like.

Next, a wiring substrate 104 is disposed so as to extend beyond the peripheral edge of the stack of the base 102 and the display panel 101 and be bent to the rear surface side of the base 102. In the case of the present embodiment, a circuit substrate 103 and the wiring substrate 104 are connected in advance, and after the wiring substrate 104 has been disposed, the circuit substrate 103 and the base 102 are fixed.

Next, a heat conductive member 106 is attached to the rear surface of an electronic component 105. In the case of the present embodiment, to be specific, the electronic component 105 is attached to the circuit substrate 103, and a sheet-shaped tacky heat conductive member 106 is adhesively attached to the rear surface of the electronic component 105.

Next, a bezel 172 is disposed long the entire periphery end of the stack of the base 102 and the display panel 101, and the bezel 172 and the base 102 are fixed.

Next, a back cover 171 serving as the rear structural member 107 is fixed to the base 102 by using a connecting member 108. The distance between the electronic component 105 and the back cover 171 is thereby reduced, as a result of which the heat conductive member 106 can be maintained in a compressed state by the electronic component 105 and the back cover 171. Furthermore, the heat conductive member 106 is deformed by the pressure of the back cover 171, and a part of the heat conductive member 106 presses the surface of the circuit substrate 103 around the electronic component 105 and a connecting portion 141 connecting the wiring substrate 104 and the circuit substrate 103.

Through the steps described above, the organic EL display apparatus 100 according to the present embodiment is produced. Note that the order of the steps included in the production method described above may vary.

With the organic EL display apparatus 100 described above, the heat conductive member 106 is compressed between the electronic component 105 and the rear structural member 107, and the heat conductive member 106 makes close contact with both the electronic component 105 and the rear structural member 107. Accordingly, heat generated from the electronic component 105 can be efficiently transferred to the rear structural member 107. Also, a member having a large area such as the back cover 171 can be used as the rear structural member 107, and it is therefore possible to efficiently dissipate transferred heat.

Furthermore, the heat conductive member 106 protects the connecting portion 141 connecting the wiring substrate 104 and the circuit substrate 103 by pressing the connecting portion 141, and it is therefore possible to suppress a situation in which the wiring substrate 104 is unintentionally separated from the circuit substrate 103. Also, due to the difference between the thermal expansion coefficient of the base 102 and the thermal expansion coefficient of the rear structural member 107 or the like, even if a force is applied in a direction that displaces the heat conductive member 106 with respect to the electronic component 105, it is possible to resist the force. Also, even if the heat conductive member 106 is displaced, because the heat conductive member 106 is in contact with the entire rear surface of the electronic component 105, there is almost no loss in the efficiency of transmission of the heat generated from the electronic component 105 to the rear structural member 107.

Next, variations of the organic EL display apparatus 100 will be described.

Variation 1

Figure 5:
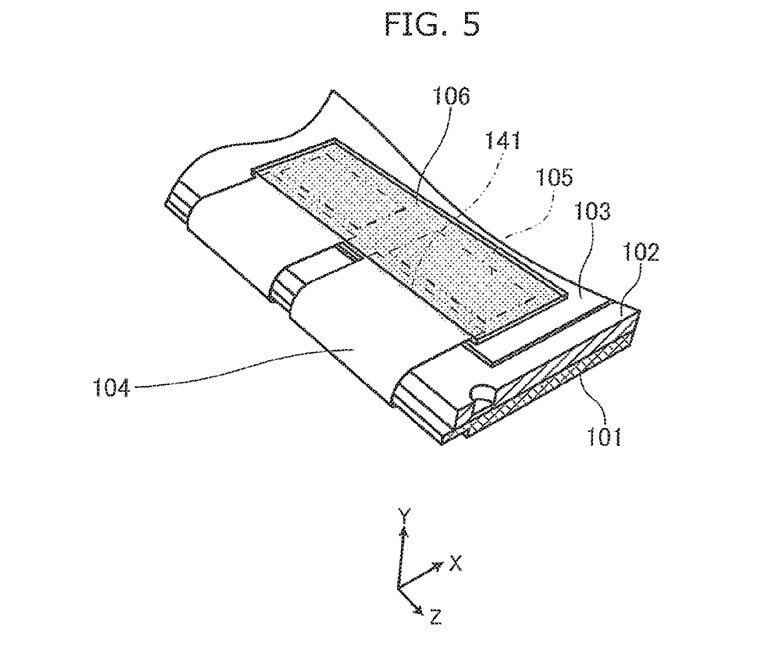
FIG. 5 is a perspective view showing a relationship between an electronic component and a heat conductive member according to Variation 1.

FIG. 5 is a perspective view showing a relationship between an electronic component and a heat conductive member according to Variation 1.

As shown in the diagram, the heat conductive member 106 may be sized to cover a plurality of electronic components 105.

This configuration makes it easy to perform the operation of attaching the heat conductive member 106.

Variation 2

Figure 6:
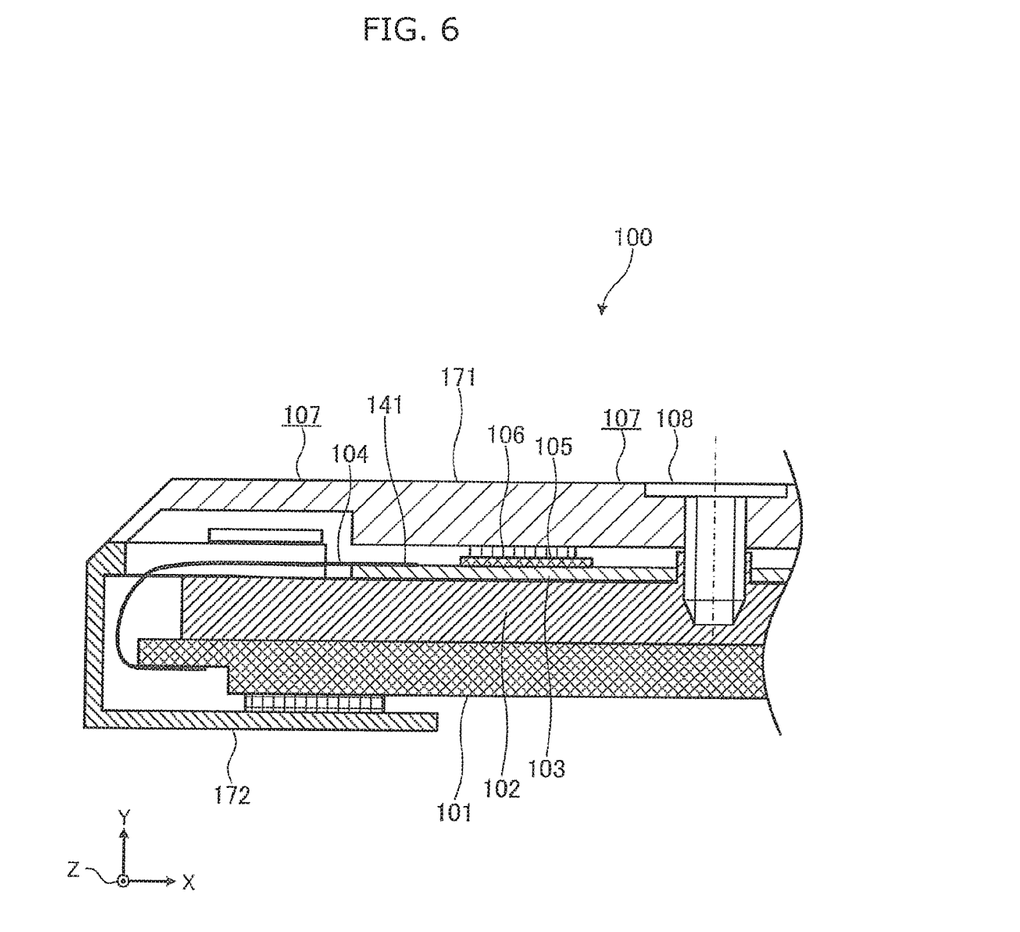
FIG. 6 is a side view showing one of variations in size of the heat conductive member in cross section.

FIG. 6 is a side view showing one of variations in size of the heat conductive member in cross section.

Figure 7:
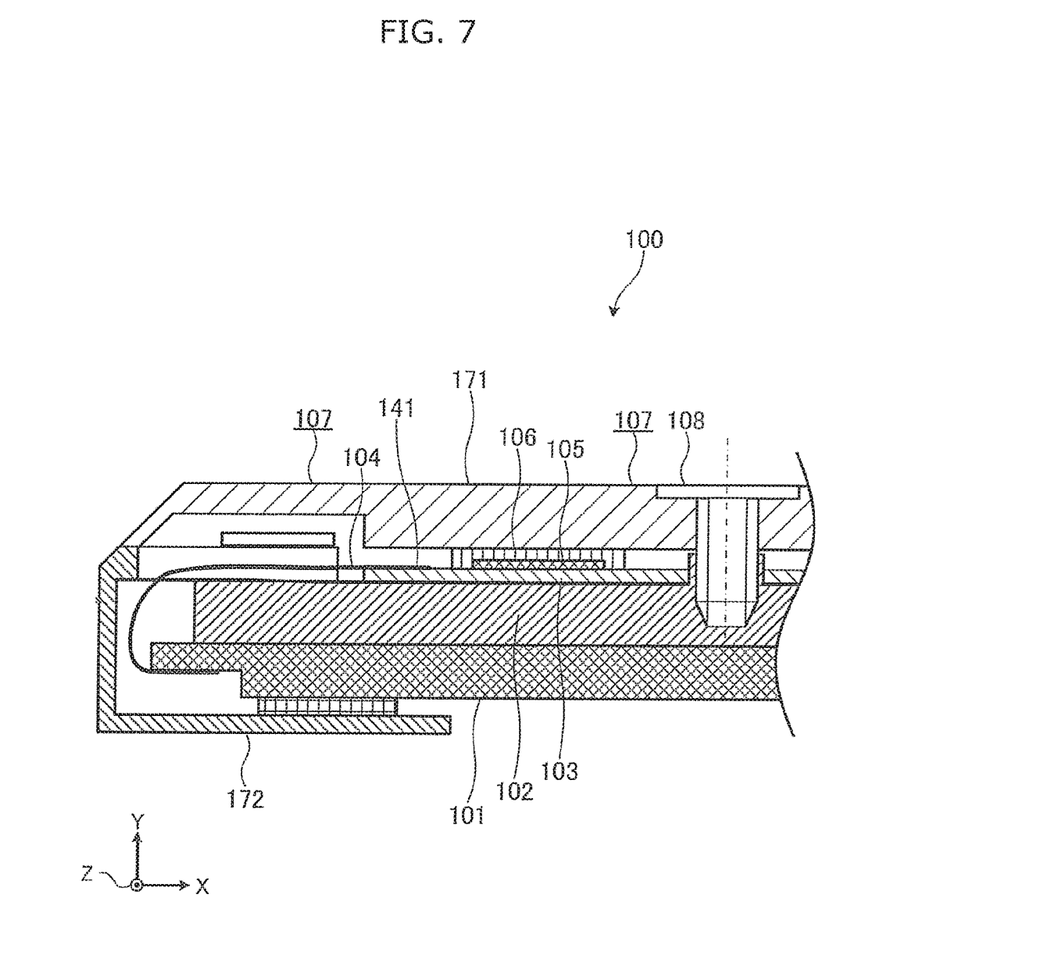
FIG. 7 is a side view showing another variation in size of the heat conductive member in cross section.

FIG. 7 is a side view showing another variation in size of the heat conductive member in cross section.

As shown in FIG. 6, the heat conductive member 106 may be smaller than the electronic component 105. Alternatively, as shown in FIG. 7, the heat conductive member 106 may be disposed so as to extend along the rear surface of the electronic component 105 to the outside of the electronic component 105, and deformed by a compressive force generated by the connecting member 108 so as to come into contact with the circuit substrate 103 around the electronic component 105.

Variation 3

Figure 8:
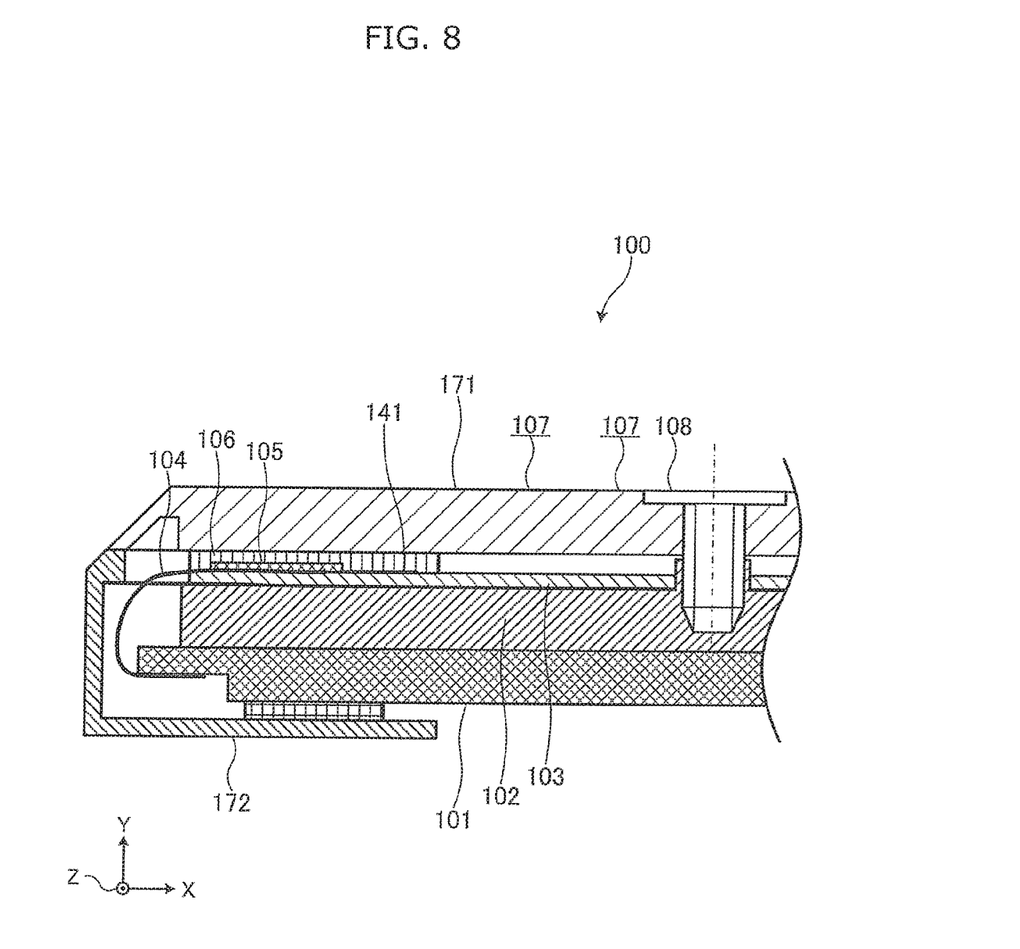
FIG. 8 is a side view showing an example of an electronic component being attached to a wiring substrate in cross section.

FIG. 8 is a side view showing an example of an electronic component being attached to a wiring substrate in cross section.

As shown in the diagram, in the case where the electronic component 105 is attached to the wiring substrate 104, or in other words, in the case where the wiring substrate 104 is a COF, it is preferable that the circuit substrate 103 is disposed so as to extend to a portion that is located between the wiring substrate 104 and the base 102, the portion being where the electronic component 105 is disposed.

According to the aspect described above, despite the fact that the electronic component 105 is attached to the flexible wiring substrate 104, as a result of the rear structural member 107 and the base 102 being connected by the connecting member 108, a compressive force is applied to the electronic component 105 via the circuit substrate 103, and the heat conductive member 106 can be compressed between the rear structural member 107 and the electronic component 105.

Variation 4

Figure 9:
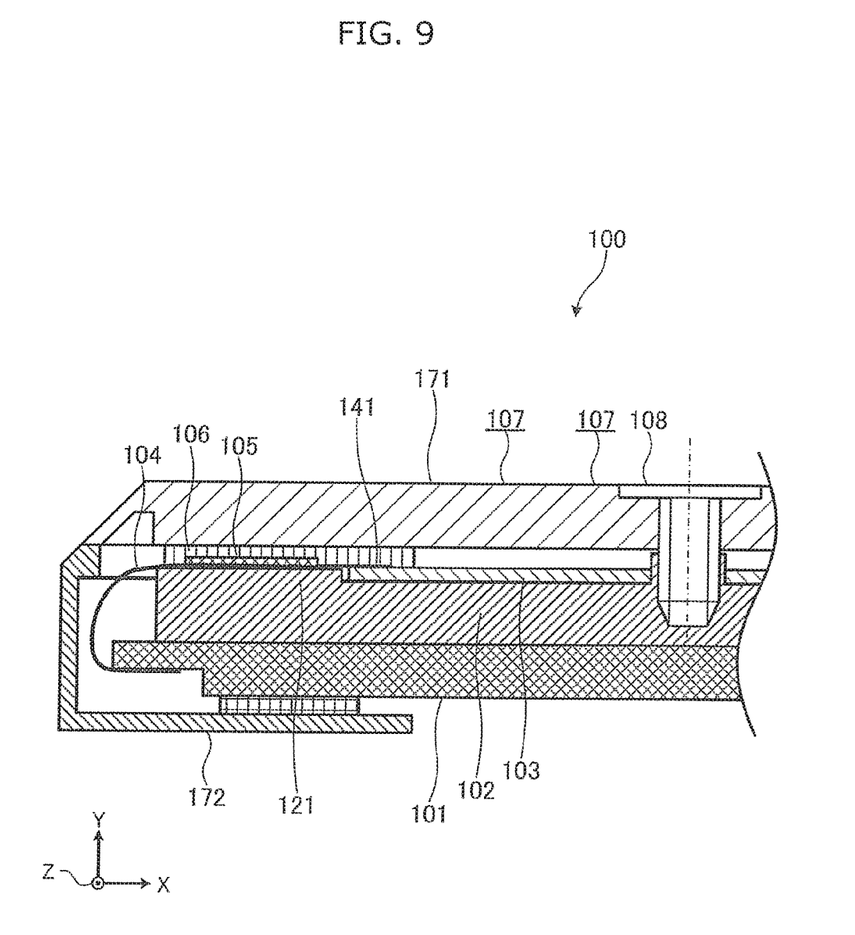
FIG. 9 is a side view showing another example of an electronic component being attached to a wiring substrate in cross section.

FIG. 9 is a side view showing another example of an electronic component being attached to a wiring substrate in cross section.

As shown in the diagram, in the case where the electronic component 105 is attached to the wiring substrate 104, the base 102 preferably has a protrusion portion 121 protruding toward the electronic component 105. To be specific, the protrusion portion 121 preferably protrudes by a length corresponding to about the thickness of the circuit substrate 103.

According to the aspect described above, despite the fact that the electronic component 105 is attached to the flexible wiring substrate 104, as a result of the rear structural member 107 and the base 102 being connected by the connecting member 108, a compressive force is applied to the electronic component 105 via the protrusion portion 121 of the base 102, and the heat conductive member 106 can be compressed between the rear structural member 107 and the electronic component 105.

Other Embodiments

As examples of the technique disclosed in the present application, Embodiment 1 and the variations thereof have been described above. However, the technique according to the present disclosure is not limited thereto, and is applicable to embodiments obtained by making modifications, replacements, additions, omissions and the like the embodiment described above as appropriate. Also, a new embodiment may be obtained by any combination of the structural elements described in Embodiment 1 and the variations thereof described above.

For example, in Embodiment 1, a television set including an organic EL display panel is used as the organic EL display apparatus 100. However, the organic EL display apparatus 100 may be an apparatus other than a television set. For example, the organic EL display apparatus 100 may be implemented as a monitor apparatus that displays a video input from the outside, a digital signage used as an advertising medium, as well as a mobile terminal, a tablet terminal and a table-like organic EL display apparatus that receive user's operations through a touch panel, and the like.

In the foregoing, the embodiment has been described as an example of the technique according to the present disclosure. For this purpose, the accompanying drawings and the detailed description have been given.

Accordingly, the structural elements illustrated in the accompanying drawings and described in the detailed description include not only structural elements required to solve the problem, but also structural elements that are merely given to illustrate the above technique and thus are not required to solve the problem. For this reason, the structural elements that are not required to solve the problem should not be construed as requirements of the present disclosure just because of the fact that they are illustrated in the accompanying drawings and described in the detailed description.

Also, the embodiment described above is given merely to illustrate the technique according to the present disclosure, and thus various modifications, replacements, additions, omissions and the like can be made within the scope of the claims or the range of equivalency.

INDUSTRIAL APPLICABILITY

The present disclosure relates to an organic EL display apparatus that displays images, characters and moving images, and is applicable to an organic EL display apparatus that is required to be thin. To be specific, the present disclosure is applicable to electronic devices such as a television set, a monitor display, a digital signage, a mobile terminal, a tablet terminal and a table-like organic EL display apparatus.

What is claimed is:

1. A display apparatus, comprising:
a display panel that displays images;
a plate-shaped base that is disposed on a rear surface side of the display panel, the rear surface side being opposite to a display surface side of the display panel where the images are displayed;
a flexible wiring substrate that is connected to a peripheral edge portion on the display surface side of the display panel;
a circuit substrate that is disposed on a rear surface side of the base and is connected to the wiring substrate;
an electronic component that is attached to the circuit substrate;
a heat conductive member that is attached to a rear surface of the electronic component and that is over the circuit substrate;
a rear structural member that is a structural member disposed on a rear surface side of the heat conductive member to cover the heat conductive member and that is a back cover covering a rear surface of the display panel; and
a connecting member that mechanically connects the base and the back cover and generates a compressive force that compresses the heat conductive member being sandwiched by the electronic component and the back cover,
wherein the heat conductive member is disposed to further extend to a connecting portion connecting the wiring substrate and the circuit substrate, and is brought into contact with the connecting portion by a compressive force generated by the connecting member.

2. The display apparatus according to claim 1,
wherein the heat conductive member is disposed to extend along a rear surface of the electronic component to outside of the electronic component, and is brought into contact with at least one of the wiring substrate and the circuit substrate to which the electronic component is attached by a compressive force generated by the connecting member.

3. The display apparatus according to claim 1,
wherein in a case where the electronic component is attached to the wiring substrate,
the circuit substrate is disposed to extend to a portion that is located between the wiring substrate and the base, the portion being where the electronic component is disposed, and
a compressive force is applied to the electronic component via the circuit substrate.

4. The display apparatus according to claim 1,
wherein in a case where the electronic component is attached to the wiring substrate,
the base includes a protrusion portion protruding toward the electronic component, and
a compressive force is applied to the electronic component via the protrusion portion.

5. The display apparatus according to claim 1,
wherein the display panel is an organic electroluminescent display panel.

6. A display apparatus, comprising:
a display panel that displays images;
a plate-shaped base that is disposed on a rear surface side of the display panel, the rear surface side being opposite to a display surface side of the display panel where the images are displayed;
a flexible wiring substrate that is connected to a peripheral edge portion on the display surface side of the display panel;
a circuit substrate that is disposed on a rear surface side of the base and is connected to the wiring substrate;
an electronic component that is attached to the circuit substrate;
a heat conductive member that is attached to a rear surface of the electronic component and that is over the circuit substrate;
a rear structural member that is a structural member disposed on a rear surface side of the heat conductive member to cover the heat conductive member and that is a back cover covering a rear surface of the display panel; and
a connecting member that mechanically connects the base and the back cover and generates a compressive force that compresses the heat conductive member being sandwiched by the electronic component and the back cover,
wherein in a case where the electronic component is attached to the wiring substrate,
the circuit substrate is disposed to extend to a portion that is located between the wiring substrate and the base, the portion being where the electronic component is disposed, and
a compressive force is applied to the electronic component via the circuit substrate.

7. A display apparatus, comprising:
a display panel that displays images;
a plate-shaped base that is disposed on a rear surface side of the display panel, the rear surface side being opposite to a display surface side of the display panel where the images are displayed;
a flexible wiring substrate that is connected to a peripheral edge portion on the display surface side of the display panel;
a circuit substrate that is disposed on a rear surface side of the base and is connected to the wiring substrate;
an electronic component that is attached to the circuit substrate;
a heat conductive member that is attached to a rear surface of the electronic component and that is over the circuit substrate;
a rear structural member that is a structural member disposed on a rear surface side of the heat conductive member to cover the heat conductive member and that is a back cover covering a rear surface of the display panel; and
a connecting member that mechanically connects the base and the back cover and generates a compressive force that compresses the heat conductive member being sandwiched by the electronic component and the back cover, wherein the heat conductive member is disposed to extend along a rear surface of the electronic component to outside of the electronic component, and is brought into contact with at least one of the wiring substrate and the circuit substrate to which the electronic component is attached by a compressive force generated by the connecting member, and wherein in a case where the electronic component is attached to the wiring substrate, the circuit substrate is disposed to extend to a portion that is located between the wiring substrate and the base, the portion being where the electronic component is disposed, and a compressive force is applied to the electronic component via the circuit substrate.

8. A display apparatus, comprising:

a display panel that displays images;

a plate-shaped base that is disposed on a rear surface side of the display panel, the rear surface side being opposite to a display surface side of the display panel where the images are displayed;

a flexible wiring substrate that is connected to a peripheral edge portion on the display surface side of the display panel;

a circuit substrate that is disposed on a rear surface side of the base and is connected to the wiring substrate;

an electronic component that is attached to the circuit substrate;

a heat conductive member that is attached to a rear surface of the electronic component and that is over the circuit substrate;

a rear structural member that is a structural member disposed on a rear surface side of the heat conductive member to cover the heat conductive member and that is a back cover covering a rear surface of the display panel; and a connecting member that mechanically connects the base and the back cover and generates a compressive force that compresses the heat conductive member being sandwiched by the electronic component and the back cover, wherein the heat conductive member is disposed to extend along a rear surface of the electronic component to outside of the electronic component, and is brought into contact with at least one of the wiring substrate and the circuit substrate to which the electronic component is attached by a compressive force generated by the connecting member, and wherein in a case where the electronic component is attached to the wiring substrate, the base includes a protrusion portion protruding toward the electronic component, and a compressive force is applied to the electronic component via the protrusion portion.

9. A display apparatus, comprising:

a display panel that displays images;

a plate-shaped base that is disposed on a rear surface side of the display panel, the rear surface side being opposite to a display surface side of the display panel where the images are displayed;

a flexible wiring substrate that is connected to a peripheral edge portion on the display surface side of the display panel;

a circuit substrate that is disposed on a rear surface side of the base and is connected to the wiring substrate;

an electronic component that is attached to the circuit substrate;

a heat conductive member that is attached to a rear surface of the electronic component and that is over the circuit substrate;

a rear structural member that is a structural member disposed on a rear surface side of the heat conductive member to cover the heat conductive member; and a connecting member that mechanically connects the base and the rear structural member, wherein the heat conductive member is disposed to further extend to a connecting portion connecting the wiring substrate and the circuit substrate, and is brought into contact with the connecting portion by a compressive force generated by the connecting member.

* * * * *

UNITED STATES PATENT AND TRADEMARK OFFICE
CERTIFICATE OF CORRECTION

PATENT NO. : 10,687,445 B2
APPLICATION NO. : 16/117844
DATED : June 16, 2020
INVENTOR(S) : Kenichi Masumoto Page 1 of 1

It is certified that error appears in the above-identified patent and that said Letters Patent is hereby corrected as shown below:

On the Title Page

Item (72), please change "Kenichi Matsumoto, Osaka (JP)" to read --- Kenichi Masumoto, Osaka (JP) ---.

After item (63), please insert -- (30) Foreign Application Priority Data
Jun. 26, 2014 (JP)...................2014-131524 --.

Signed and Sealed this
First Day of September, 2020

Andrei Iancu
*Director of the United States Patent and Trademark Office*